United States Patent [19]

Takahashi

[11] 4,184,085

[45] Jan. 15, 1980

[54] SEMICONDUCTOR MEMORY DEVICE COMPRISING A P-N JUNCTION IN A POLYCRYSTALLINE SEMICONDUCTOR LAYER

[75] Inventor: Sakari Takahashi, Tokyo, Japan

[73] Assignee: Nippon Electric Co., Ltd., Tokyo, Japan

[21] Appl. No.: 868,321

[22] Filed: Jan. 10, 1978

[30] Foreign Application Priority Data

Jan. 12, 1977 [JP] Japan .................................. 52/2623

[51] Int. Cl.² ...................... G11C 11/40; H01L 27/04
[52] U.S. Cl. ..................................... 307/238; 357/23; 357/41; 357/59; 365/186
[58] Field of Search ...................... 357/23, 24, 41, 59; 365/186; 307/238

[56] References Cited

U.S. PATENT DOCUMENTS

| | | | |
|---|---|---|---|
| 3,855,610 | 12/1974 | Masuda et al. | 357/23 |
| 3,858,232 | 12/1974 | Boyle et al. | 357/24 |
| 3,865,654 | 2/1975 | Chang et al. | 357/42 |
| 3,943,545 | 3/1976 | Kim | 357/24 |
| 4,060,738 | 11/1977 | Tasch, Jr. et al. | 357/59 |

OTHER PUBLICATIONS

Ho et al., IBM Tech. Discl. Bulletin, vol. 15, No. 2, Jul. 1972, pp. 412–413.

*Primary Examiner*—William D. Larkins
*Attorney, Agent, or Firm*—Hopgood, Calimafde, Kalil, Blaustein & Lieberman

[57] ABSTRACT

A semiconductor memory device of a surface-charge type comprises a p-type silicon substrate having a silicon dioxide film thereon and memory cells partly in the substrate and partly thereon in rows and columns. Each cell comprises an n+-type region beneath the oxide film, a polysilicon layer on the oxide film, and an insulator film integral on the polysilicon layer with the oxide films at positions where the polysilicon layer is not present. The polysilicon layer comprises a p-type portion serving as a storage capacitor electrode and an n-type portion forming a p-n junction with the p-type portion. The n-type portion is common to cells of each column to serve as a transfer gate electrode and a word line. A metal film formed on the insulator film is connected to the n+-type region of cells of each row to serve as a bit line. That region of the substrate which is opposite to the capacitor electrode is doped with a donor to insure storage of information-representative charges even with the capacitor electrode grounded. To reduce the resistance of the capacitor electrode, an intermediate metal film may be formed on the capacitor electrode except at its portion adjacent to the p-n junction.

19 Claims, 13 Drawing Figures

SEMICONDUCTOR MEMORY DEVICE COMPRISING A P-N JUNCTION IN A POLYCRYSTALLINE SEMICONDUCTOR LAYER

BACKGROUND OF THE INVENTION

This invention relates to a semiconductor memory device formed of an integrated circuit of an insulated-gate field effect type known as an MOS integrated circuit and, more particularly, to a semiconductor memory device comprising memory cells of the surface-charge type.

Ever since MOS elements have been used successfully as memory cells, a continued problem has been to increase the memory capacity of a memory device formed on a semiconductor chip. Attempts have therefore been made to increase the bit density of the memory device by reducing the number of circuit elements of a unit memory cell while simplifying the structure of the circuit elements. So far, a one-transistor cell, such as the one described later is a unit memory cell consisting of the least possible number of elements. A surface-charge memory cell has been developed developed to achieve a further increased bit density. The latter memory cell, however, is complicated in structure and is more difficult to manufacture. As a result, the conventional surface-charge memory device is poorer in yield and reliability than the sophisticated one-transistor-cell memory device.

SUMMARY OF THE INVENTION

It is therefore an object of the present invention to provide a semiconductor memory device which is of a high bit density and yet simple in structure.

It is another object of this invention to provide a semiconductor memory device of the type described, which is easy to manufacture and is reliable.

A semiconductor memory device to which this invention is applicable comprises a semiconductor substrate of a first conductivity type, an insulator film on the substrate, an impurity-doped region of a second conductivity type opposite to the first conductivity type in the substrate beneath the insulator film, and a polycrystalline semiconductor layer on the insulator film. According to this invention, the polycrystalline semiconductor layer comprises a first portion of the first conductivity type and a second portion of the second conductivity type contiguous to the first portion.

DESCRIPTION OF THE PREFERRED EMBODIMENTS

Figure 1:
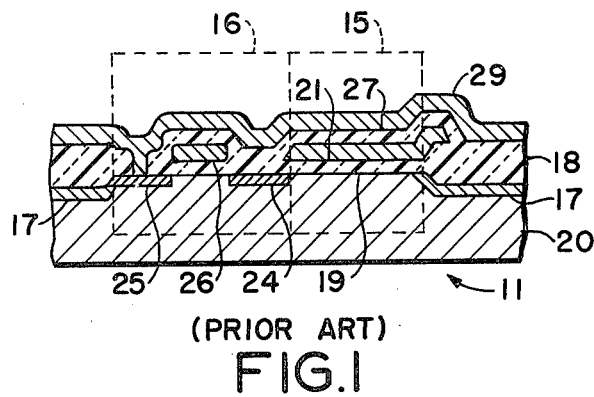
FIG. 1 is a schematic cross-sectional view of a memory cell of a conventional one-transistor-cell memory device.

The unit memory cell of a conventional one-transistor-cell memory device shown in FIG. 1 is first described so as to provide a better understanding of the present invention. As described by James E. Coe et al in "Electronics" issued Feb. 19, 1976, pages 116–121, one-transistor cells are formed partly in a semiconductor substrate 11 of a first conductivity type and partly thereon in rows and columns. Each cell comprises a storage capacitor 15 and a transfer gate transistor 16 which are arranged side by side and commonly bounded by a channel stopper 17 formed adjacent to a principal surface of the substrate 11. The principal surface is oxidized into a thick oxide film 18, herein called a field oxide film, on the channel stopper 17 and into a thin oxide film 19, called a gate oxide film, on the remaining area. A bulk 20 of the semiconductor is thereby left in the substrate 11. The capacitor 15 comprises an electrode 21 of a first polycrystalline silicon layer partly on the field oxide film 18 and partly on that portion of the gate oxide film 19 which is contiguous to the field oxide film 18. The transistor 16 has source and drain regions 24 and 25 of a second conductivity type in the substrate bulk 20 with a space left between the two regions 24 and 25 and a transfer gate electrode 26 of a second polycrystalline silicon layer on the gate oxide film 19 over the inter-region space. The polysilicon layers 21 and 26 are covered with an overlying oxide film 27 that is contiguous to the field oxide film 18 and is made integral with the gate oxide film 19 at positions where the polysilicon layers 21 and 26 are not present. A metal film 29 is formed on the overlying oxide film 27 and brought into electrical contact with the drain region 25 through a contact hole formed in the integral oxide films 19 and 27. The gate electrode 26 is common to transistors, such as 16, of a column of the one-transistor cells to serve as a word line. The metal film 29 is common to the transistors of a row of the cells to serve as a bit line. The one-transistor-cell memory device is simple in structure and easy to manufacture.

Figure 2:
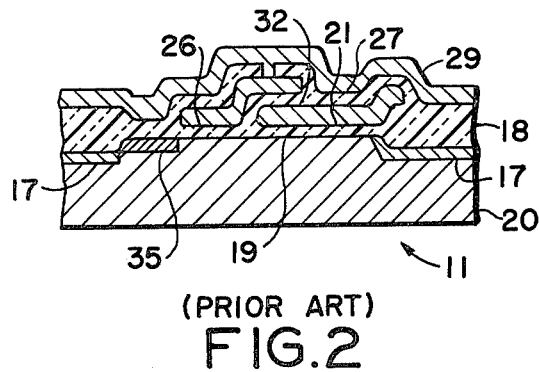
FIG. 2 is a schematic cross-sectional view of a surface-charge memory cell of another conventional semiconductor memory device.

Another, conventional unit memory cell as shown in FIG. 2 and which is also disclosed in the above-referenced Coe et al article is herein called a surface-charge memory cell and comprises a semiconductor substrate 11 of a first conductivity type. A storage capacitor 15 contiguous to a channel stopper 17 comprises, opposite partly on a field oxide film 18 and partly on a gate or underlying oxide film 19 to a bulk 20 of the substrate 11, an electrode 21 of a first polysilicon layer. A transfer gate electrode 26 of a second polysilicon layer has a first portion on that surface of the underlying oxide film 19 which is adjacent to the capacitor electrode 21 and a second portion over a portion of the capacitor electrode 21. In addition to an overlying oxide film 27 and a metal film 29 similar to those described with reference to FIG. 1, the surface-charge memory cell comprises an intermediate oxide film 32 between the above-mentioned portion of the capacitor electrode 21 and the second portion of the gate electrode 26. The intermediate oxide film 32 is made integral with the underlying and the overlying oxide films 19 and 27. The metal film 29 is electrically connected to the second portion of the gate electrode 26 through a contact hole formed in the overlying oxide film 27 to serve as a word line common to the cells of a row. For use as a bit line common to the cells of a column, a region 35 of a second conductivity type is formed in the substrate bulk 20 beneath the underlying oxide film 19 on that side of the first portion of the gate electrode 26 which is opposite to the capacitor electrode 21. A double polysilicon level of the capacitor and the gate electrodes 21 and 26 saves an area necessary on the substrate 11 for each cell in cooperation with the omission of one of the source and drain regions 24 and 25 described in conjunction with FIG. 1. The double polysilicon level, however, complicates the processes of manufacture to reduce the yield and the reliability of the device. Furthermore, the metal film 29 is rendered liable to break.

Figure 3:
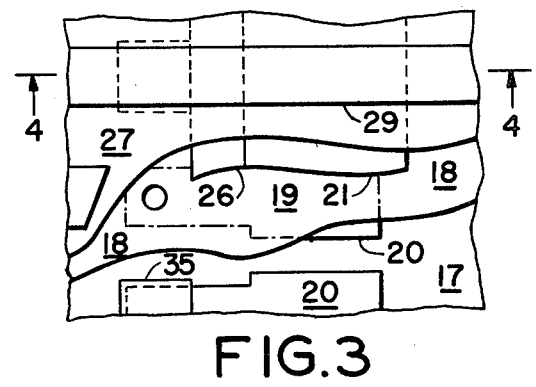
FIG. 3 is a partially cut-away schematic top view of a portion of a semiconductor memory device according to a first embodiment of this invention.
Figure 4:
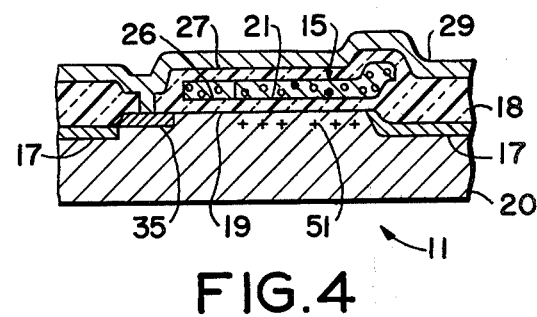
FIG. 4 is a schematic cross-sectional view of a memory cell taken on a line 4—4 shown in FIG. 3.

Referring now to FIGS. 3 and 4, unit cells of a semiconductor memory device according to a first embodiment of this invention are formed partly in a semiconductor substrate 11 of a first conductivity type and partly thereon preferably in rows and columns. According to a preferred aspect of the first embodiment, the substrate 11 is formed of p-type silicon of a specific conductivity of about 2 ohm-cm. A storage capacitor or memory condenser 15 of each unit cell comprises, adjacent to a channel stopper 17 and opposite partly on a field silicon dioxide film 18 of a thickness of about 0.8 micron and partly on a gate silicon dioxide film 19 of a thickness of about 0.04 micron to a portion of a bulk of the substrate 11, an electrode 21 provided by a first portion of a polycrystalline silicon layer that is about 0.4 micron thick and is doped with a p-type impurity, such as boron, to a concentration of the order of $1 \times 10^{18}/cm^3$. As a word line common to cells of each column, a transfer gate electrode 26 is provided by that second portion of the polysilicon layer which is contiguous to the first portion and is of an opposite conductivity type. For example, the polysilicon layer is heavily doped at the second portion with an n-type impurity, such as phosphorus, to a higher concentration of the order of $1 \times 10^{20}/cm^3$. The polysilicon layer having a p-n junction between the capacitor and the gate electrodes 21 and 26 is covered with an overlying silicon dioxide film 27 that is about 0.4 micron thick and is rendered integral with the field oxide film 18 and, at positions where there is no electrode 21 or 26, with the gate oxide film 19. An aluminium film 29 is formed on the overlying oxide film 27 in a configuration of a stripe to serve as a bit line common to the cells of each row. By doping the substrate bulk 20 with an impurity, such as arsenic, of a second conductivity type opposite to the first one to a higher concentration of the order of $1 \times 10^{20}/cm^3$, an n+-type region 35 is formed beneath the gate oxide film 19 on that side of the gate electrode 26 which is opposite to the capacitor electrode 21. The aluminium film 29 is electrically connected to the region 35 through a contact hole formed in the integral oxide films 19 and 27.

Figure 5:
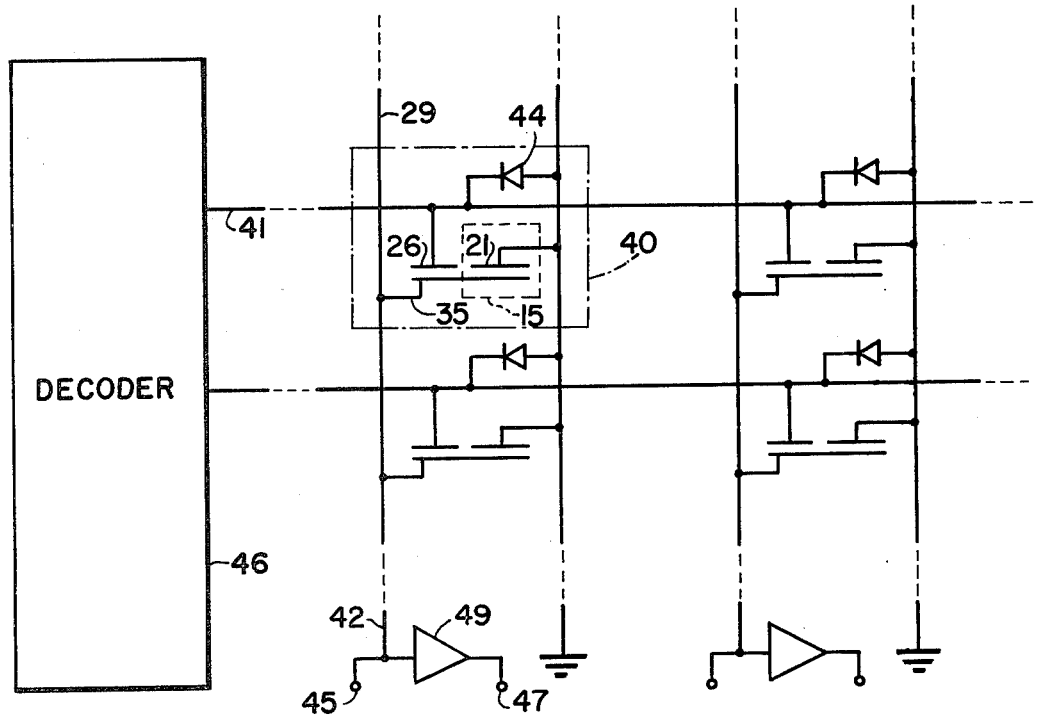
FIG. 5 is a block diagram of a portion of the memory device depicted in FIGS. 3 and 4, together with a peripheral circuit for putting the memory device into operation.

FIG. 5 schematically illustrates a unit cell 40 of a semiconductor memory device according to the first embodiment which is placed at a cross point of a word line 41 and a bit line 42. As therein shown, the unit cell comprises a storage capacitor 15 having a p-type polysilicon capacitor electrode 21, an n+-type polysilicon transfer gate electrode 26 serving as a portion of the word line 41. An aluminium film 29 connected to an n+-type region 35 to serves as the bit line 42. The p-n junction between the capacitor and the gate electrodes 21 and 26 is herein represented by a diode 44. For operation, the capacitor electrodes, such as 21, are kept at a preselected reference potential, which may be ground. Unless selected as presently described, the word lines, such as 41, are supplied with the reference potential. Information to be written in the unit cell 40 is supplied to the bit line 42 from an input terminal 45 connected thereto. A decoder 46 supplies a driving potential, about 10 volts higher than the reference potential, to the word line 41 to select the cell 40 and to write the information in the storage capacitor 15. More particularly, charges indicative of the information are transferred from the bit line 42 to that portion of the substrate bulk 20 (not shown in FIG. 5) which is opposite to the capacitor electrode 21 with the gate silicon dioxide film 19 (not depicted herein) interposed. On reading the information out of the cell 40, the word line 41 is supplied with the driving potential from the decoder 46 while the bit line 42 is left floating. The read-out information is delivered to an output terminal 47 connected to the bit line 42 through a sense amplifier 49. For rewriting, it is necessary only to feed back the read-out information from the output terminal 47 to the input terminal 45. Inasmuch as the diodes, such as 44, are never forwardly biased, leakage currents flowing therethrough are kept very small as will be described hereunder more specifically. In other words, the capacitor and the gate electrodes 21 and 26 of each unit cell are substantially insulated from each other. The diodes therefore do not adversely affect the operation of the memory device at all.

Referring back to FIGS. 3 and 4, the unit cell according to the preferred aspect of the first embodiment of this invention comprises that region 51 of the substrate bulk 20 which is situated under the capacitor electrode 21 at a depth of about 0.025 micron from an interface between the gate silicon dioxide film 19 and the substrate bulk 20 and doped with a doner, such as phosphorus, to an ion concentration of about $5 \times 10^{12}/cm^3$. The doner-doped region 51 serves to lower the surface potential of the substrate 11 to such an extent that the storage capacitor 15 may store the information without an appreciable loss of charges even with the capacitor electrode 21 grounded. The channel stopper 17 is formed as a p+-type region by doping the p-type substrate bulk 20 with a p-type impurity, such as boron, of a concentration of the order of $1 \times 10^{16}/cm^3$ for the purpose of suppressing the parastic MOS effect.

FIG. 6 illustrates the steps employed to fabricate the in FIGS. 3 and 4 by providing at first a p-type silicon substrate 11 of a specific conductivity of about 2 ohm-cm. After a principal surface of the substrate 11 is selectively covered with a mask (not shown) of an oxidation-resistant material, such as silicon nitride, boron is implanted in the substrate 11 at a concentration of about $5 \times 10^{16}/cm^3$ to form a p+-type region that serves as the channel stopper 17. Thereafter, the substrate 11 is heated to a high temperature in an oxidizing atmosphere so that that portion of the substrate 11 which is not covered with the mask is oxidized into a silicon dioxide film that is from about 0.6 to 0.8 micro thick and serves as the field oxide film 18. After the mask is removed, the substrate 11 is again oxidized so as to form another silicon dioxide film that is from about 0.04 to 0.05 micron thick and serves as the gate oxide film 19. The oxide films 18 and 19 are contiguous to each other and to the p-type silicon bulk 20 of the substrate 11. A polycrystalline silicon layer 55 is formed on the field and the gate oxide films 18 and 19 by vapor phase growth techniques to a thickness of about 0.4 micron. Another silicon nitride film 56 is formed on the polysilicon layer 55 to a thickness of about 0.2 micron.

Figure 6A:
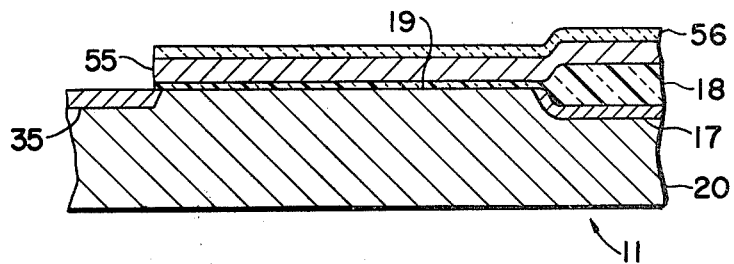
FIGS. 6 A through E are exploded views illustrating a method of manufacturing the memory cell depicted in FIGS. 3 and 4.

As best shown in FIG. 6A, the silicon nitride film 56 and the polysilicon layer 55 are subjected to patterning to uncover a predetermined surface area of the substrate bulk 20. Through the uncovered area, arsenic is implanted in the bulk 20 to a concentration of about $1 \times 10^{20}/cm^3$ to form the $n^+$-type region 35.

Figure 6B:
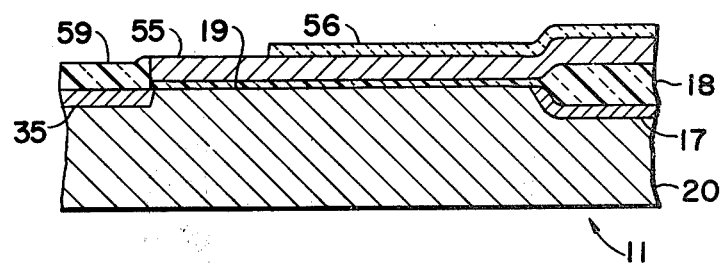

As depicted in FIG. 6B, a silicon dioxide film 59 is formed to a thickness of about 0.4 micron on the $n^+$-type region 35 by thermal oxidation of the substrate 11. During the thermal oxidation, the silicon nitride film 56 protects the polysilicon layer 55 against oxidation. Thereafter, the silicon nitride film 56 is subjected to selective photoetching to remain on a first portion 61 of the polysilicon layer 55 and to uncover a second portion 62 thereof.

Figure 6C:
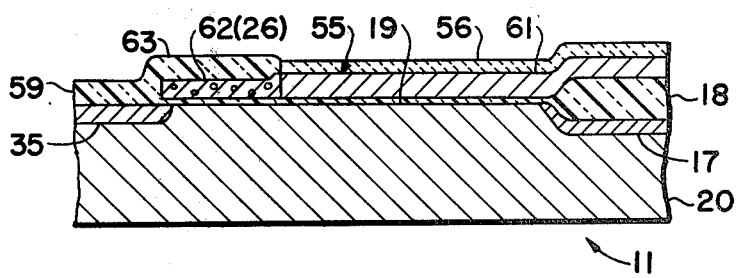

In FIG. 6C, the second portion 62 of the polysilicon layer 55 is turned into an n-type region to serve as the transfer gate electrode 26 of the unit memory cell. To this end, the half-manufactured memory cell shown in FIG. 6B is placed in a phosphorus-including atmosphere and kept at a temperature of about 1000° C. for about 10 minutes. The phosphorus is thereby selectively diffused into the second portion 62 through the uncovered surface to a concentration of about $1 \times 10^{21}/cm^3$ to make the gate electrode 26 have a resistance of about 20 ohm/□. Thereafter, another silicon dioxide film 63 is formed by thermal oxidation to a thickness of about 0.4 micron to be integral side by side with the previously formed oxide film 59 and to serve as a first portion of the overlying oxide film 27.

Figure 6D:
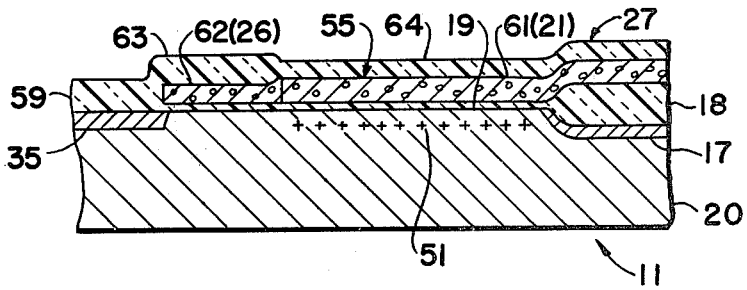

As shown in FIG. 6D, the silicon nitride film 56 is removed by the use of boiling phosphoric acid. Thereafter, ion implantation into the substrate bulk 20 of phosphorus ions is carried out with an ion energy of about 360 keV and a dose of about $3 \times 10^{12}/cm^2$ to form the donor-doped region 51 at a depth of about 0.025 micron from an interface contiguous under the capacitor electrode 21 to the gate oxide film 19. This results in a phosphorus ion concentration of about $5 \times 10^{12}/cm^3$. Ion implantation of boron is now resorted to with an ion energy of about 60 keV and a dose of about $5 \times 10^{13}/cm^2$ to turn the first polysilicon layer portion 61 into the capacitor electrode 21 doped with boron to a concentration of about $1 \times 10^{18}/cm^3$. Subsequently, still another silicon dioxide film 64 is formed as a second portion of the overlying oxide film 27 by thermal oxidation to a thickness of about 0.4 micron.

Figure 6E:
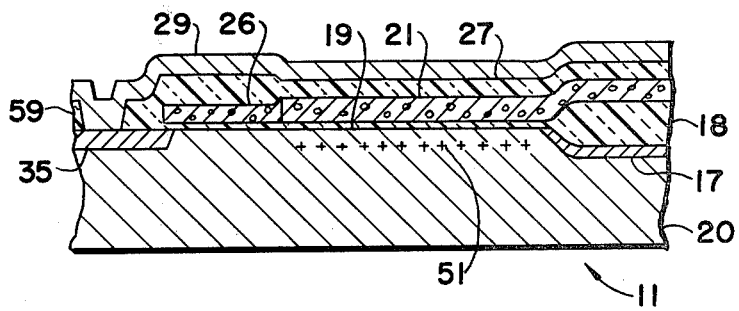

In FIG. 6E, a contact hole is formed through the previously formed oxide film 59 covered with a thin layer portion of the overlying oxide film 27. Silicon-containing aluminium is evaporated onto the overlying oxide film 27 to be brought into electrical contact with the $n^+$-type region 35 through the contact hole and to become the aluminium film 29.

On manufacturing the capacitor and the gate electrodes 21 and 26, it is possible to preliminarily dope the whole polysilicon layer 55 (FIGS. 6A and 6B) with boron and to subsequently resort to ion implantation of phosphorus by the use of a mask of photoresist. For sufficient conductivity, the gate electrode 26 is preferably doped with an impurity to saturation. The dose exemplified in connection with FIG. 6D is preferred in this respect. The impurity concentration of the capacitor electrode 21 is discussed in a later portion of this specification.

Figure 7:
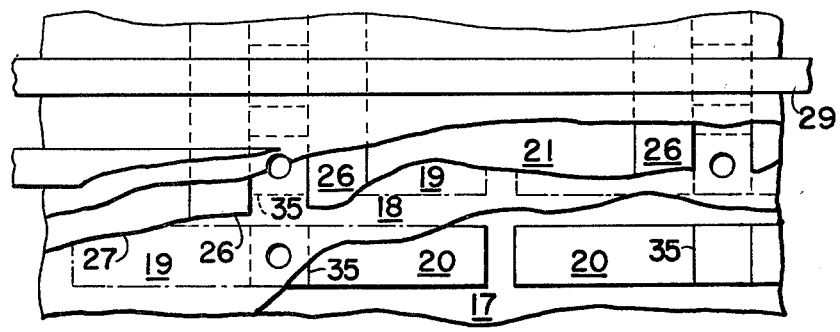
FIG. 7 is a partially cut-away schematic top view of a portion of a modification of the memory device shown in FIG. 3.

The semiconductor memory device illustrated in FIG. 7 is a modification of the first embodiment of this invention. That device comprises unit cells arranged along the metal films, such as 29, back to back and front to front with the $n^+$-type region 35 used in common by two front-to-front arranged cells. This raises the bit density.

Figure 8:
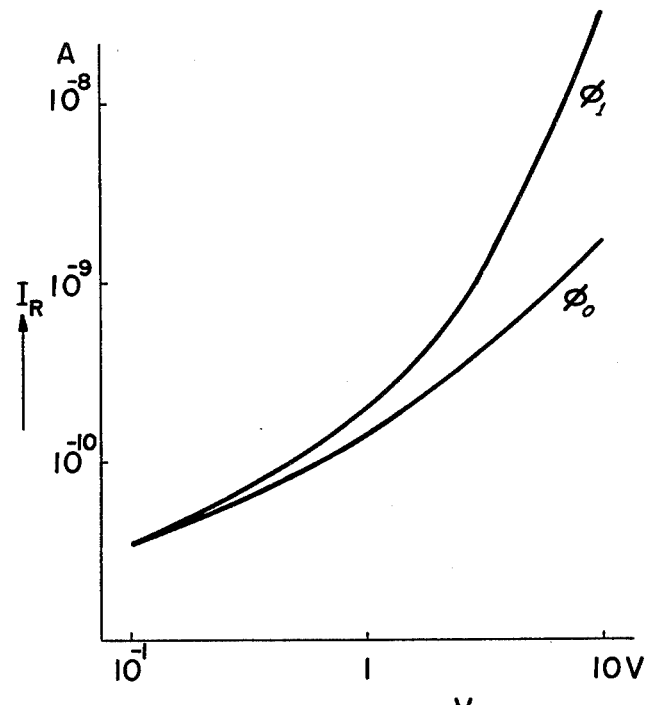
FIG. 8 shows the characteristics of p-n junctions comprised by semiconductor memory devices according to this invention.

The characteristic curves of to FIG. 8 indicate that the diode 44 (FIG. 5) formed between the capacitor and the transfer gate electrodes 21 and 26 of each memory cell is never forwardly biased. By way of example, memory cells comprising the polysilicon layers 55 (FIGS. 6A and 6B) of a common thickness of 0.4 micron were manufactured by doping the gate electrodes 26 to a common phosphorus concentration of the order of $1 \times 10^{21}/cm^3$ and carrying out the ion implantation of boron into the capacitor electrodes 21 with the above-mentioned dose $\phi_0$ of $5 \times 10^{13}/cm^2$ and a higher dose $\phi_1$ of $2 \times 10^{14}/cm^2$. The resistances of the capacitor electrodes 21 were about $1 \times 10^9$ and $1 \times 10^5$ ohm/{ and showed a nonlinear increase when the dose was reduced from the order of $1 \times 10^{14}/cm^2$ through the exemplified value of $5 \times 10^{13}/cm^2$. Leakage currents $I_R$ per 100 microns in length of a p-n junctions were measured with the backward voltage $V_R$ for the p-n junctions varied from 0 volt to the above-exemplified driving potential of about 10 volts to give the results plotted in FIG. 8. The total leakage current of a semiconductor memory device according to the first embodiment of this invention is about from ten to a hundred times as high as the plotted values. From the results of measurements, it is preferred that the dose of boron is $1 \times 10^{14}/cm^2$ or less and that the driving potential is at most 10 volts above the reference potential. It is to be noted in connection with memory devices according to the first embodiment that the resistance of the capacitor electrodes should be sufficiently low to keep the capacitor electrodes substantially at the reference potential regardless of the charges stored in the donor-doped region or therearound.

Figure 9:
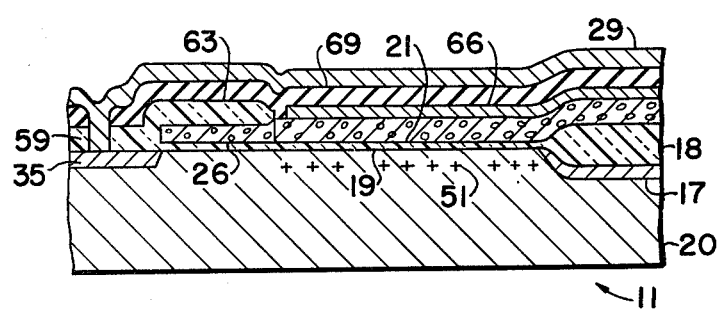
FIG. 9 is a schematic cross-sectional view of a memory cell of a semiconductor memory device according to a second embodiment of this invention.

FIG. 9 illustrates a unit cell of a semiconductor memory device according to a second embodiment of this invention. As therein shown, the unit cell comprises similar parts designated by like reference numerals as in FIGS. 3 through 5 and an intermediate metal film 66 on the capacitor electrode 21 except at its portion adjacent to the p-n junction. As the material of the intermediate metal film 66, it is possible to use a refractory metal, such as molybdenum, tungsten, or rhodium, or an alloy of the refractory metal with silicon, such as molybdenum silicide ($MoSi_2$), tungsten silicide ($WSi_2$), or rhodium silicide ($RhSi_2$). The intermediate metal film 66 is formed by any one of known methods, such as evaporation, vapor phase growth, and sputtering. The intermediate metal film 66 insures the capacitor electrodes, such as 21, to be kept at the reference potential even when the electrodes are doped with a small quantity of the impurity. Inasmuch as the capacitor electrode 21 is now covered with the intermediate metal film 66, it is necessary to form at least that portion 69 of the overlying insulator film 27 which lies on the film 66 by, for example, vapor phase growth of phosphate glass. In the illustrated example, the insulator film 69 is formed also on the overlying oxide film portion 63 having a thin extension on the previously formed oxide film 59. Another intermediate metal film (not shown) may be formed also on the transfer gate electrode 26 except at its portion adjacent to the p-n junction.

It is now understood that the field and the gate oxide films 18 and 19 may be any insulator films placed on a principal surface of a semiconductor substrate 11. This applies to the overlying oxide film 27. The capacitor and the transfer gate electrodes 21 and 26 may be formed side by side in any other polycrystalline semiconductor layer. With respect to the donor-doped region 51 for grounded capacitor electrodes the donor concentration should theoretically be higher than a lower limit $N_D$ given by:

$$N_D = [\epsilon_{ox}/(qt_{ox})][\sqrt{2q\epsilon_{si}N_{si}(|V_{BG}|+V_D)}+V_D],$$

where $\epsilon_{ox}$ and $\epsilon_{si}$ represent the dielectric constants of the gate insulator film 19 and the semiconductor substrate 11; $t_{ox}$, the thickness of the gate insulator film 19; q, the unit charge; $N_{si}$, the acceptor concentration of the substrate 11; $V_{BG}$, the potential of the substrate 11; and $V_D$, the driving potential. For a memory device comprising a 2 ohm-cm silicon substrate 11 and a 0.05-micron thick gate silicon dioxide film 19, the lower limit $N_D$ is about $1.5 \times 10^{12}/cm^3$ when $V_{BG} = -2$ volts and $V_D = 7$ volts.

As has thus far been described, each unit cell of a semiconductor memory device according to this invention comprises a capacitor electrode and a transfer gate electrode contiguous to each other in a single polycrystalline semiconductor layer with a p-n junction formed therebetween. It is therefore possible in accordance with this invention to render the pattern for the circuit elements dense. The unit cell is simpler in structure and easier to manufacture than a conventional surface-charge memory cell. This makes it possible to provide a reliable semiconductor memory device and to avoid damages to the metal bit lines as well as to the capacitor and the gate electrodes. Furthermore, this raises the yield. It is readily possible in accordance with this invention to provide a p-channel semiconductor memory device comprising an n-type semiconductor substrate 11, an n-type capacitor electrode 21, a p-type transfer gate electrode 26, and an acceptor-doped substrate portion 51. It is possible in FIG. 6A to form the heavily impurity-doped region 35 by implanting the impurity in the substrate 11 with the gate insulator film 19 left thereon. It should be noted here that the insulator film lying on the region 35 is herein called the gate insulator film 19 merely for convenience and should strictly be called an extension thereof. Instead of the mask of photoresist mentioned hereinabove, use may be made of a silicon dioxide or any other insulator film formed on the first portion 61 of the polycrystalline semiconductor layer 55 as the mask for thermally diffusing the impurity, such as phosphorus, selectively into the second portion 62.

What is claimed is:

1. A semiconductor memory device comprising a plurality of memory cells, each of said memory cells having a storage capacitor and a transfer gate transistor for charging and discharging said storage capacitor therethrough, said transfer gate transistor including an impurity region of one conductivity type formed in a first surface portion of a semiconductor substrate of the opposite conductivity type, a first insulating film formed on a second surface portion of said substrate adjacent to said first surface portion and a first semiconductor layer of said one conductivity type formed on said first insulating film, said storage capacitor including a second insulating film formed on a third surface portion of said substrate and a second semiconductor layer of said opposite conductivity type formed on said second insulating film and contiguous to said first semiconductor layer.

2. The semiconductor memory device of claim 1, in which said storage capacitor further includes a region situated in said third surface portion of said substrate and doped with an impurity of said one conductivity type.

3. The semiconductor memory device of claim 1, in which said storage capacitor further includes a metal film formed on said second semiconductor layer except at a part of said second semiconductor layer adjacent to said first semiconductor layer.

4. A semiconductor memory device comprising a semiconductor substrate of one conductivity type, a field insulating film formed in said semiconductor substrate, and a plurality of memory cells for storing information arranged in row and column directions and substantially surrounded by and separated from each other by said field insulating film, each of said memory cells including an impurity region of the opposite conductivity type formed in a first surface portion of said substrate, a first insulating film formed on a second surface portion of said substrate adjacent to said first surface portion, a third surface portion of said substrate provided between said second surface portion and said field insulating film, a second insulating film formed on said third surface portion and extending between said first insulating film and said field insulating film, and a polycrystalline semiconductor layer disposed on said first and second insulating films, said polycrystalline semiconductor layer having a first portion of said opposite conductivity type provided on said first insulating film and a second portion of said one conductivity type contiguous to said first portion, provided on said second insulating film, and extending to said field insulating film.

5. The semiconductor memory device of claim 4, in which said impurity regions of said memory cells are continuously formed in one direction of said row and column directions.

6. The semiconductor memory device of claim 4, in which said memory cells further include a region that is situated in said third surface portion of said substrate and doped with an impurity of said opposite conductivity type.

7. The semconductor memory device of claim 4, in which said memory cells further include a metal film formed on said second portion of said polycrystalline semiconductor layer except at a part of said second portion adjacent to said first portion.

8. The semiconductor memory device of claim 4, in which said first and second insulating films are continuously formed.

9. The semiconductor memory device of claim 4, in which adjacent two of said memory cells have a common polycrystalline semiconductor layer provided on said field insulating film and being continuous to the second portions of said polycrystalline semiconductor layers of said two adjacent memory cells.

10. A semiconductor memory device comprising a semiconductor substrate of one conductivity type, a field insulating film at least partially embedded in said substrate, a plurality of active regions of said substrate arranged in row and column directions and substantially separated from each other by said field insulating film, and a plurality of pairs of memory cells provided in said active regions, respectively, each pair of said memory cells including an impurity region of the opposite conductivity type formed in a first surface portion of said active region, second and third surface portions of said active region adjacent to said first surface portion, respectively, and arranged in one direction, a fourth surface portion positioned between said second surface portion and said field insulating film, a fifth surface portion positioned between said third surface portion and said field insulating film, first insulating films formed on said second and third surface portions, respectively, second insulating films formed on said fourth and fifth surface portions, respectively, each of said second insulating films having two ends in one direction, one of said two ends facing to said first insulating films and another of said ends being adjacent to said field insulating film, and polycrystalline semiconductor layers provided on said first and second insulating films, each of said polycrystalline semiconductor layers having a first portion of said opposite conductivity type provided on said first insulating films and a second portion of said one conductivity type contiguous to said first portion and provided on said second insulating films.

11. The semiconductor memory device of claim 10, in which said pair of memory cells further includes regions situated in said fourth and fifth surface portions and doped with an impurity of said opposite conductivity type.

12. The semiconductor memory device of claim 10, in which said pair of memory cells further includes metal films formed on said second portions of said polycrystalline semiconductor layers except at parts of said second portions adjacent to said first portions.

13. A semiconductor memory device comprising a semiconductor substrate of a first conductivity type, an insulator film on said substrate, an impurity-doped region of a second conductivity type opposite to said first conductivity type in said substrate beneath said insulator film, a polycrystalline semiconductor layer on said insulator film having a first portion of said first conductivity type and a second portion of said second conductivity type contiguous to said first portion, and a metal film on said first portion of said polycrystalline semiconductor layer except at that portion of said first portion which is adjacent to said second portion.

14. A semiconductor memory device comprising a semiconductor substrate of a first conductivity type, a plurality of substantially parallel insulator films on said substrate, a plurality of impurity-doped regions of a second conductivity type opposite to said first conductivity type in said substrate and partly covered with said insulator films, a plurality of polycrystalline semiconductor layers respectively extended on each of said insulator films adjacent to the impurity-doped regions partly covered with said insulator films and having a first portion of said first conductivity type farther from the impurity-doped regions partly covered with said insulator films and a second portion of said second conductivity type contiguous to said first portion and adjacent to the impurity-doped regions partly covered with said insulator films, and a metal film on said first portion of each of said polycrystalline semiconductor layers except at that portion of said first portion adjacent to the second portion of each of said polycrystalline semiconductor layers.

15. A semiconductor memory device comprising a semiconductor substrate of one conductivity type; an impurity region of the opposite conductivity type formed in a first surface portion of said substrate; a first insulating film formed on a second surface portion of said substrate adjacent to said first surface portion; a second insulating film formed on a third surface portion of said substrate; a semiconductor layer on said first and second insulating films, said semiconductor layer including a first portion of said opposite conductivity type positioned on said first insulating film, and a second portion of said one conductivity type positioned on said second insulating film and forming a P/N junction with said first portion; first means for applying a control signal to said first portion of said semiconductor layer; and second means for applying a reference potential to said second portion of said semiconductor layer.

16. The semiconductor device of claim 15, in which said control signal has a predetermined high level and a predetermined low level, and said P/N junction is maintained at a reverse-biased condition at said reference potential and at said predetermined high and low potential levels.

17. The semiconductor device of claim 15, in which said semiconductor device further comprises a region situated in said third surface portion of said substrate and doped with an impurity of said opposite conductive type.

18. The semiconductor device of claim 15, further comprising third means coupled to said impurity region for supplying electric charges to said third surface portion via said second surface portion in response to a predetermined level of said control signal.

19. The semiconductor device of claim 16, further comprising fourth means coupled to said impurity region for sensing electric charges discharged from said third surface portion via said second surface portion.

* * * * *